(12) United States Patent
Snow et al.

(10) Patent No.: US 8,077,098 B2
(45) Date of Patent: Dec. 13, 2011

(54) ANTENNA TEST SYSTEM

(75) Inventors: Jeffrey M. Snow, Bloomington, IN (US); Michael Schumm, Bloomington, IN (US); William L. Shaff, Bedford, IN (US); Terry Carlson, Washington, IN (US); Carl Baker, Avoca, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 504 days.

(21) Appl. No.: 12/121,346

(22) Filed: May 15, 2008

(65) Prior Publication Data
US 2009/0284425 A1  Nov. 19, 2009

(51) Int. Cl.
*G01R 29/10* (2006.01)

(52) U.S. Cl. ........ 343/703; 342/169; 342/171; 342/172; 342/360; 455/67.11; 455/101; 455/423

(58) Field of Classification Search .................. 343/703; 342/165, 169, 360, 173, 174, 172, 171, 372; 324/640, 637; 455/67.11, 423, 67.14, 226.1, 455/67.1, 67.2, 67.4, 101
See application file for complete search history.

(56) References Cited

U.S. PATENT DOCUMENTS

| | | | | |
|---|---|---|---|---|
| 5,021,792 A * | 6/1991 | Hwang | ..................... | 342/357.11 |
| 5,077,557 A * | 12/1991 | Ingensand | ........................ | 342/52 |
| 5,185,610 A * | 2/1993 | Ward et al. | ............... | 342/357.11 |
| 5,193,064 A * | 3/1993 | Maki | .............................. | 701/221 |
| 5,225,842 A * | 7/1993 | Brown et al. | ............ | 342/357.09 |
| 5,347,286 A | 9/1994 | Barbitch | | |
| 5,568,152 A * | 10/1996 | Janky et al. | ............... | 342/357.08 |
| 5,986,603 A * | 11/1999 | Schipper | .................. | 342/357.09 |
| 6,697,752 B1 | 2/2004 | Korver et al. | | |
| 6,785,553 B2 | 8/2004 | Chang et al. | | |
| 6,963,301 B2 | 11/2005 | Schantz et al. | | |
| 7,292,183 B2 | 11/2007 | Bird et al. | | |
| 7,339,522 B2 * | 3/2008 | Dobson | ......................... | 342/387 |
| 7,357,842 B2 * | 4/2008 | Ishikawa et al. | ............... | 118/503 |
| 2003/0122078 A1 | 7/2003 | Fritzel | | |
| 2005/0060093 A1 | 3/2005 | Ford et al. | | |
| 2005/0200523 A1 | 9/2005 | Durban | | |
| 2005/0203683 A1* | 9/2005 | Olsen et al. | ..................... | 701/35 |
| 2006/0027404 A1 | 2/2006 | Foxlin | | |
| 2006/0033657 A1 | 2/2006 | Lawrence et al. | | |
| 2007/0032950 A1* | 2/2007 | O'Flanagan et al. | ......... | 701/214 |
| 2007/0198159 A1 | 8/2007 | Durkos et al. | | |
| 2009/0198391 A1* | 8/2009 | Kumar et al. | ..................... | 701/2 |

OTHER PUBLICATIONS

McLean, Grant, Virtual Anechoic Chamber using GPS Signals, Journal of Navigation, Jan. 1, 2007, Abstract of pp. 33-43, vol. 60, Cambridge Univ Press, UK.

Janse et al., Impact of Alignment Errors on Cylindrical Near-Field Antenna Measurements, www.nearfield.com/amta/AMTA00_DVR-AN.htm, Jan. 25, 2008, Nearfield Systems, Carson, CA.

(Continued)

*Primary Examiner* — Hoang V Nguyen
(74) *Attorney, Agent, or Firm* — Christopher A. Monsey (57) ABSTRACT

A method and system are provided for testing antenna systems using position determination, orientation determination, test pattern analysis using a variety of factors and equipment including positions and orientation of antenna(s) under test at specific points and signal processing systems.

33 Claims, 9 Drawing Sheets

OTHER PUBLICATIONS

Mader, G. L., GPS Antenna Calibration at the national Geodetic Survey, National Geodetic Survey; NOS; NOAA, Jan. 25, 2008, Silver Spring, Maryland.

Hardesty, Mark et. al, Evolution Leads to Revolution-Helicopter Flight Testing, Sep. 14, 1999, The Boeing Company, Mesa, Arizona.

* cited by examiner

ANTENNA TEST SYSTEM

STATEMENT REGARDING FEDERALLY SPONSORED RESEARCH OR DEVELOPMENT

The invention described herein was made in the performance of official duties by an employee of the Department of the Navy and may be manufactured, used, licensed by or for the United States Government for any governmental purpose without payment of any royalties thereon.

FIELD OF THE INVENTION

A system and method is provided that relates to automated test systems, and more particularly to a highly automated test system for the purposes of pattern testing of antenna systems.

BACKGROUND OF THE INVENTION

High performance antennas are becoming increasingly prevalent as spacecraft, aircraft, ship, and ground vehicle mission requirements become more sophisticated. In particular, greater precision in simulation and design of antennas, transmitters and end items antennas and transmitters are mounted upon is needed for a variety of reasons.

One problem in the development and manufacture of antennas is the accurate measurement of antenna performance. Traditionally, antenna performance measurement was conducted by placing the antenna at a remote location, and measuring the amplitude response characteristics as a function of orientation of the antenna throughout its operational range. Required measurement distances for high gain antennas range from fifty feet to three miles or more. This measurement technique, known as far-field testing, suffers from significant practical limitations, such as susceptibility to the effects of weather, ground reflections, and increasing real estate costs.

Near-field testing was developed as an alternative to far-field testing. A typical near-field measurement system consists of three primary subsystems; a computer, a robotic positioner, and a probe. The computer provides the user interface and controls the operation of the probe. In addition, it commands the robotic positioner which moves the antenna under test (AUT), the probe, or both, over the desired virtual surface. The probe can be used to transmit or receive a radio frequency (RF) signal to/from the AUT. Consequently, for reciprocal antennas in near-field testing, the probe can transmit or receive and the AUT performs the corresponding opposite function (receiving or transmitting). One skilled in the art will appreciate that whenever an antenna is a passive linear reciprocal device, the use of the antenna in either a transmitting situation or a receiving situation is implicit. However, when an antenna or group of antennas is combined with circuit elements that are active, nonlinear, or nonreciprocal, the pattern will likely be different between transmit and receive states and so both conditions should be tested. Examples of such cases are an adaptive antenna system and a signal-processing antenna system, conical-scanning, monopulse, or compound interferometer systems. The near-field testing equipment records the amplitude and phase of a RF signal received for a series of discrete data point across a virtual surface of an AUT. This data is transformed into a far-field pattern associated with an AUT.

The two types of testing have trade-offs. With far-field testing only amplitude measurements are required (not phase) in order to derive far-field antenna patterns. Consequently, far-field testing is generally a better choice for lower frequency antennas and simple pattern cut measurements. In contrast, both amplitude and phase measurements are required for near-field testing, making it a better choice for higher frequency antennas and complete pattern and polarization measurements. Moreover, there are significant logistical limitations.

Near-field testing typically has been conducted in an indoor test facility utilizing fixed, rigid equipment with an AUT mounted on a stable, rigid fixture. In near field testing, knowledge of the precise locations of the probe and an AUT when a discrete amplitude and phase data points are recorded is a critical element. Relative movement (e.g. vibration) between the probe and an AUT may introduce inaccuracies/errors into the process. Typically, if displacement due to relative vibration (or other position errors) exceeds $\frac{1}{100}$ of the RF wavelength, accuracy of the near-field test will be reduced. Therefore, near-field test systems typically employ precise positioning components in order to minimize error. This form of testing is cumbersome and expensive. First of all it requires the presence of the antenna AUT at the test facility. Depending on the location of the antenna to be tested, the cost of its transportation to and from the test facility, and the opportunity cost while the antenna is out of service, the indoor testing process is not always a cost-effective means of evaluating an antenna. Far field testing methods also require knowledge of the location of the probe and an AUT when a discrete amplitude data point is recorded, but the need for accuracy is not as critical as with near-field testing. On the other hand, far-field testing requires large far-field test ranges, where reflections from buildings, vegetation, seasonal changes, rain, snow and ice have an effect on measurement results and repeatability of the results. For vehicle-mounted antennas, the vehicles are usually mounted on large-diameter turntables that orient the vehicle and an AUT during testing. The vehicle is not in its normal environment (over real ground), and the turntable itself can introduce error. Moreover, these large test ranges and turntables are plainly an expensive infrastructure.

Various positioning systems can be used in combination with an antenna testing system. For example, Global Positioning System (GPS) technology provides positioning information. However, traditional GPS systems used in connection with antenna test systems per se do not provide sufficient information to provide adequate testing results.

Another example of positioning systems includes Real Time Kinematics (RTK) systems, which are a particular kind of GPS in which the positional data are displayed and recorded. RTK/GPS systems can be used to improve antenna test systems in order to provide the requisite level of test precision under a wide variety of real world conditions.

SUMMARY OF THE INVENTION

A method and system are provided for testing of antenna systems, features and equipment using position determination, orientation determination, and test pattern analysis between an RF probe and antenna(s) under test at a variety points to quickly and accurately measure the far-field pattern(s).

DESCRIPTION OF THE DRAWINGS

The foregoing aspects and many of the attendant advantages of this invention will become more readily appreciated as the same become better understood by reference to the following detailed description when taken in conjunction with the accompanying drawings.

Corresponding reference characters indicate corresponding parts throughout the several views. Although the drawings represent embodiments of various features and components according to the present invention, the drawings are not necessarily to scale and certain features may be exaggerated in order to better illustrate and explain the present invention. The exemplification set out herein illustrates embodiments of the invention, and such exemplifications are not to be construed as limiting the scope of the invention in any manner.

DETAILED DESCRIPTION OF EMBODIMENTS OF THE INVENTION

For the purposes of promoting an understanding of the principles of the invention, reference will now be made to the embodiments illustrated in the drawings, which are described below. The embodiments disclosed below are not intended to be exhaustive or limit the invention to the precise form disclosed in the following detailed description. Rather, the embodiments are chosen and described so that others skilled in the art may utilize their teachings. It will be understood that no limitation of the scope of the invention is thereby intended. The invention includes any alterations and further modifications in the illustrated devices and described methods and further applications of the principles of the invention which would normally occur to one skilled in the art to which the invention relates.

A method for testing and a highly automated portable "test anywhere" test system for pattern testing of antenna systems is provided. Exemplary ATS, in accordance with the invention, quickly and accurately measure the far-field patterns of antennas and antenna/vehicle combinations. This can be done in real environments such as over dirt, grass, sand, pavement, in a town, etc. The measurements can be taken at predetermined points or on-the-fly, if unusual data indicates a need for more measurements. The collected data is then post processed to calculate the gain pattern of an AUT. This can be accomplished across multiple frequencies, heights, polarizations, and distances.

In this exemplary embodiment, the main components of the ATS include a high accuracy geo-location position sensor adapted to determine and output the coordinate location data for a portion of the ATS. The invention is herein described using GPS/RTK for high accuracy geo-location, though other geo-location technologies may suffice. A multi-axis orientation sensor such as an inertial navigation unit (INU) is adapted to determine and output "multi-axis orientation" data for a portion of the ATS (e.g., high accuracy attitude and north reference). The position sensor and INU determine and output coordinate location and orientation, respectively, of portions of the ATS. An RF Probe is positioned relative to an AUT to transmit/receive therewith, and emission measurements including amplitude data (and optionally phase) associated with the AUT are communicated to a receive station where they are sampled, time-stamped, associated with the time-stamped coordinate location and orientation data, and stored in a plurality of datasets (each including amplitude of a test signal to/from an AUT, coordinate location of an AUT, and multi-axis orientation data for an AUT, as well as optionally the phase of a test signal to/from an AUT for a plurality of test locations). A computer runs antenna test software that compensates the coordinate location data based on the multi-axis orientation data. Using the compensated position data and the sampled emission measurements, the computer presents a graphical user interface (GUI) that represents the AUT inclusive of an emission pattern representation comprising a plurality of signal characteristics.

Figure 1:
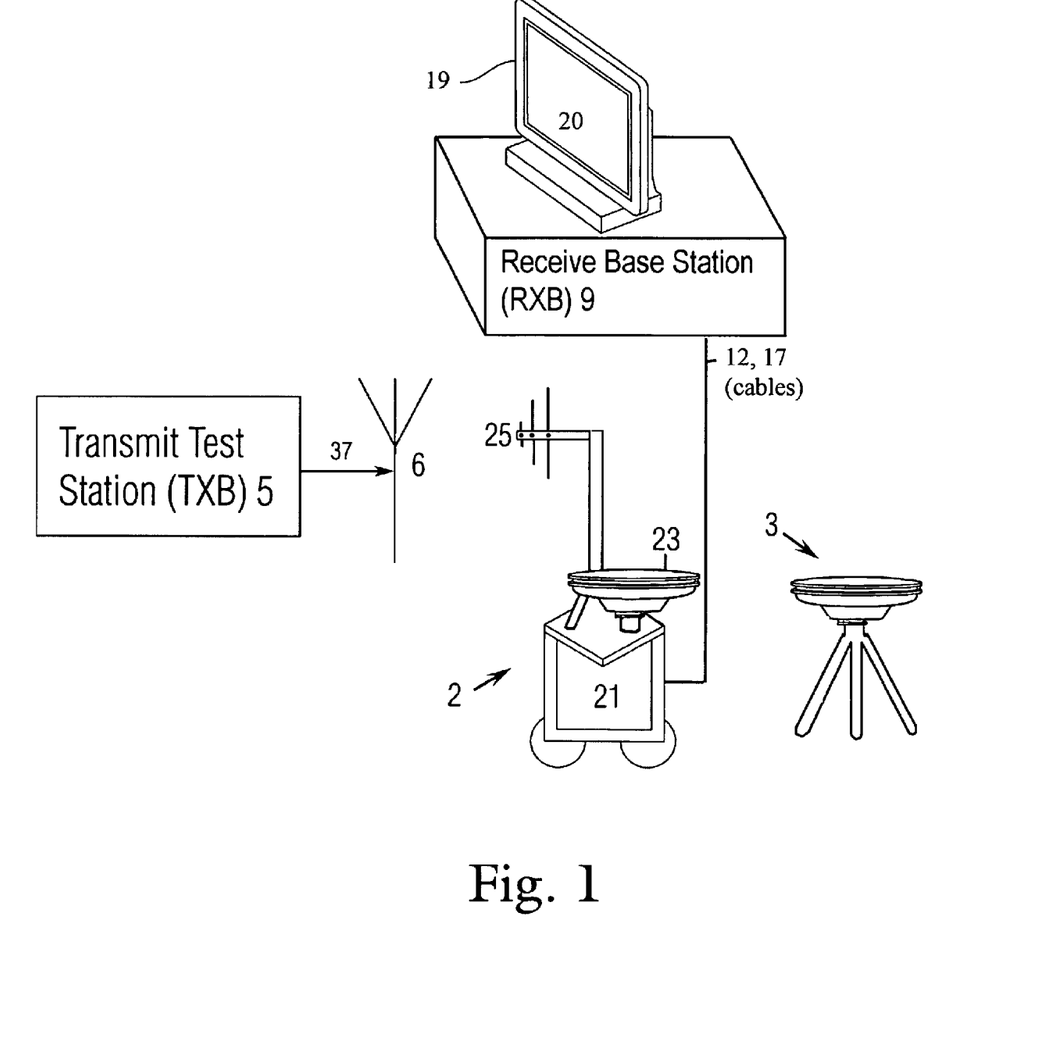
FIG. 1 is a diagram of an exemplary antenna test system (ATS)

FIG. 1 shows a diagram of one embodiment of the invention having main components implemented in an exemplary embodiment of the ATS. A Transmit Test Station (TXB) 5 is connected to an AUT 6, the TXB 5 being responsible for the generation and control of test signals, and the AUT 6 transmitting the test signals generated thereby. The test system also employs a roving test station 2 (hereinafter "rover") equipped with an RF probe 25 which in this embodiment is for reception of the test signals from an AUT 6. The rover 2 also includes a GPS/RTK position sensor 23 and INU 21. The system also includes a conventional RTK base station 3 which generates an RTK correction signal to the GPS/RTK position sensor 23 for improving the accuracy thereof. The RTK base station 3 will typically be placed 200-300 meters from the rover 2, though it can range up to six miles. The test signals transmitted by AUT 6 are received at RF probe 25 and communicated by cable 17 to a Receive Base Station (RXB) 9. Likewise, coordinate and orientation data from GPS/RTK position sensor 23 and INU 21 in rover 2 are communicated by cables 12 to the RXB 9. The RXB 9 time-stamps and records the test signals along with coordinate and multi-axis orientation data, processes them, and analyzes those signals. For that analysis, the RXB 9 includes a computer that runs ATS software and provides a graphical user interface (GUI) 20 on display 19 that allows an operator to define test scenarios, equipment configurations, test sequences, and frequency plans and presents the information in a spatially representative display. ATS software determines highly accurate probe position-location and orientation information, in order to determine the desired spatial pattern data for an AUT with greater consistency.

Figure 2:
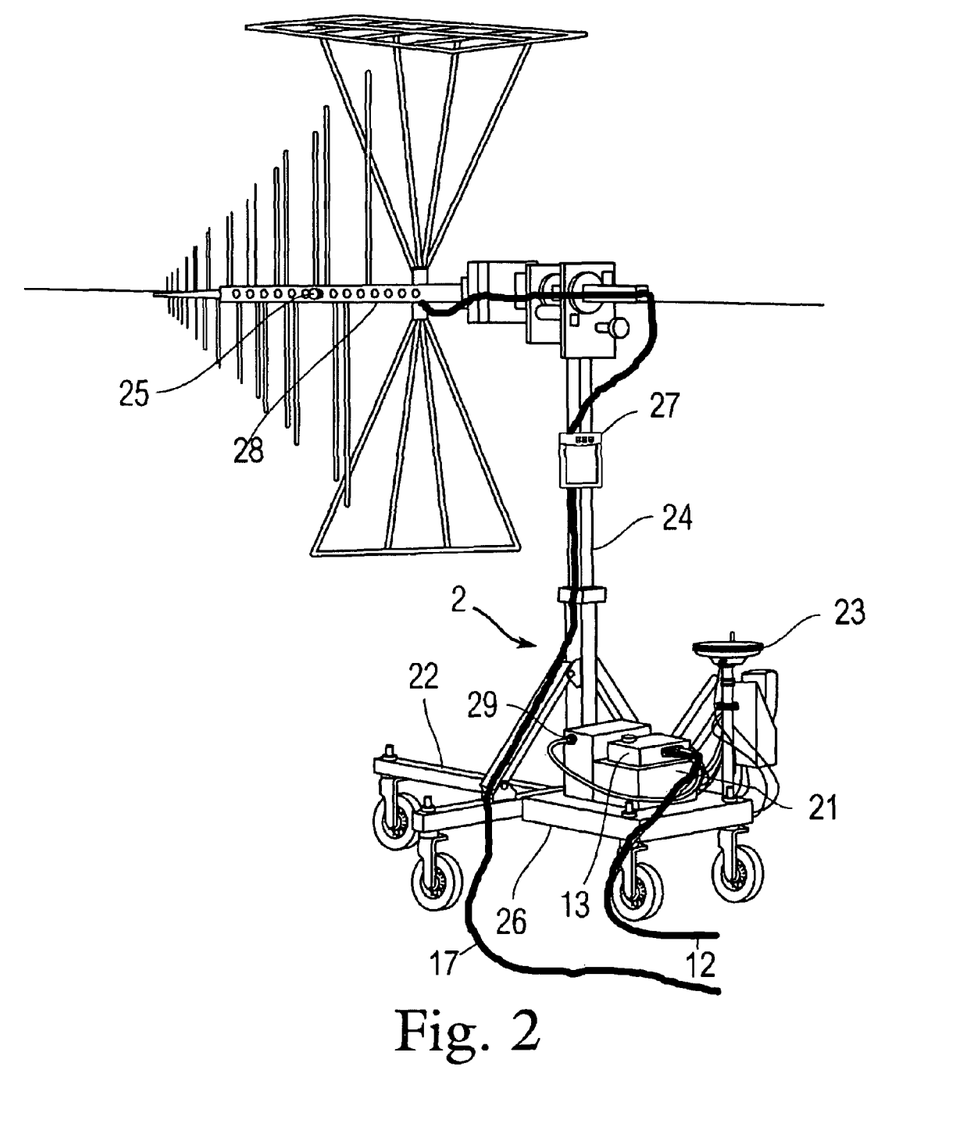
FIG. 2 is a perspective view illustrating a rover.

Referring to FIG. 2, an exemplary rover 2 generally comprises a portable structure including a platform 22 supporting a non-metallic and/or RF transparent mast 24 and an equipment tray 26 supporting a battery box 29 enclosing two BB-2590 lithium-ion MIL-Spec batteries for powering all on-board equipment. The mast 24 wields a horizontal extension arm 28 upon which RF probe 25 is mounted. A mobile device such as a conventional personal digital assistant (PDA) 27 is mounted on the mast 24 to provide navigation information to the user for moving the rover 2 (and hence RF probe 25). The RF probe 25 is connected directly to a test pattern analyzer 96 (described below) in the RXB 9 by a coaxial RF cable 17, and thereby transmits the received signal to the remote RXB 9. The GPS/RTK position sensor 23 and INU 21 are connected to a serial server 13, which is in turn in data communication with the remote RXB 9 to thereby transmit position and multi-axis orientation data to the remote RXB 9 through serial server 13. The PDA 27 is also connected through the serial server 13, and RXB 9 is connected to the serial server 13 by Ethernet cable 12. The serial server 13 preferably includes four COM ports in, and a cabled Ethernet connection output to the RXB 9. A B&B Electronics ESR904 server will suffice.

The test pattern analyzer 96 on RXB 9 could be moved onto rover 2 and thereby eliminate cable 17 provided data from the test pattern analyzer 96 transmitted to RXB 9 via cable 12 or TXB 5 via wireless server. RXB 9 could be eliminated in such a case when data is transmitted directly to TXB 5. A wireless server can also be used in place of serial server 13 which would eliminate cable 12.

The collective amplitude data (optionally phase data), position and multi-axis orientation data are time-stamped and stored on an RX base computer 94 (to be described) resident in the remote RXB 9. Beside the mast 24, RF probe 25 and PDA 27, all the on-board components of the rover 2 are physically supported atop the equipment tray 26. The RXB 9 runs control software that receives and records amplitude data taken from the RF probe 25, phase (if sampled), plus coordinate data from GPS/RTK position sensor 23, and pitch, roll, yaw, azimuth and elevation data from INU 21 (all on rover 2), all said data being taken at time discrete data points. The RXB 9 then time-stamps at least a portion of the collected data (e.g., signal, amplitude, and phase data), stores the data set, and processes the data set to render a far-field pattern related to AUT 6 (shown in FIG. 5).

Figure 3:
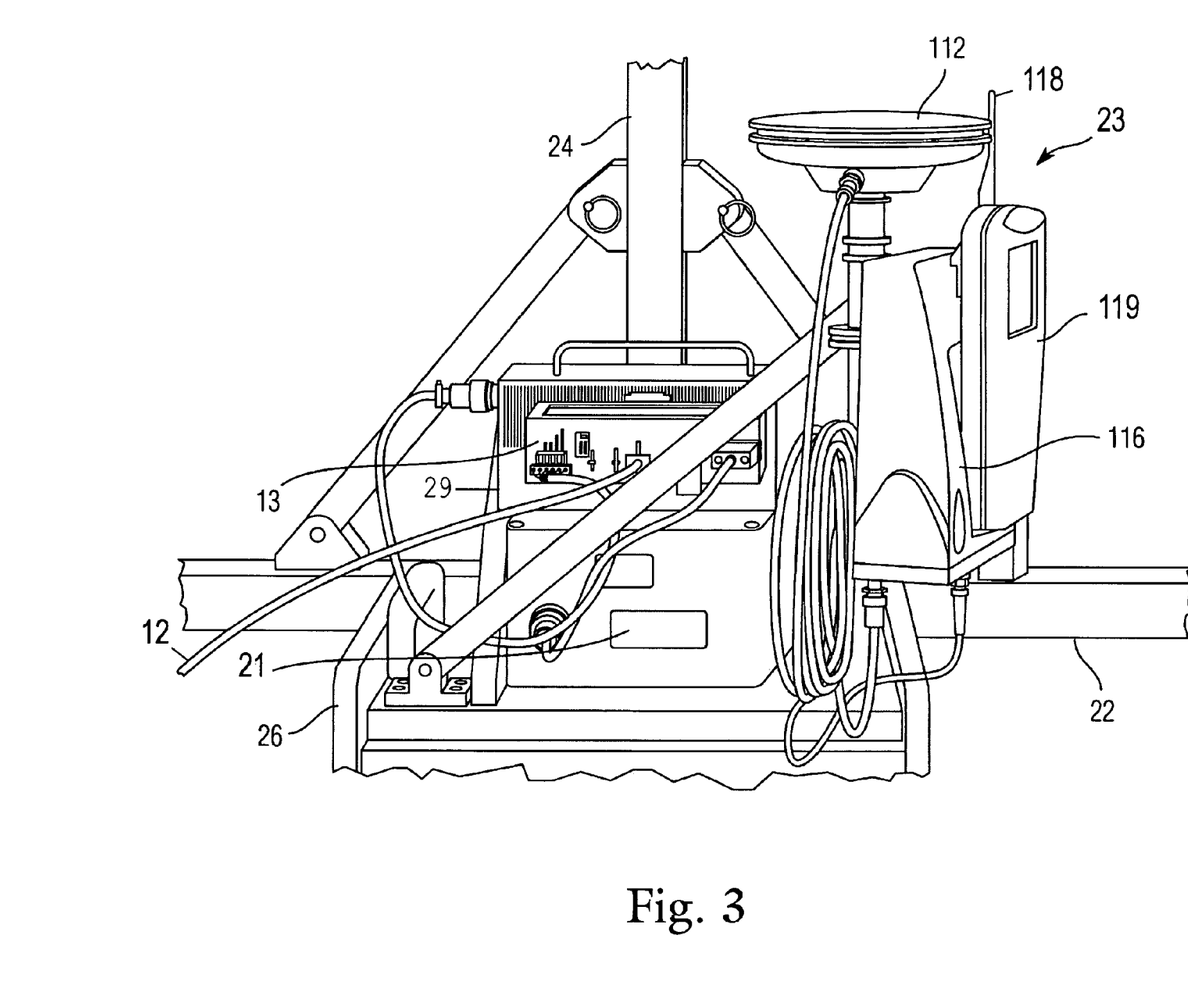
FIG. 3 is a close-up view of the rover equipment tray.

FIG. 3 is a close-up view of an exemplary equipment tray 26 for the rover 2 including platform 22 supporting the mast 24. The equipment tray 26 is mounted atop the platform 22 and preferably comprises a detachable tray formed of plastic or composite (e.g., non-metallic material) to maintain RF signal integrity. The GPS/RTK position sensor 23 and INU 21 reside on the equipment tray 26 along with the serial server 13 and battery box 29. The GPS/RTK position sensor 23 further comprises a commercially-available RTK geolocation unit including a GPS/RTK rover receiver 116 connected to a GPS/RTK antenna 112, to a UHF radio 118, and presently connected to an RTK controller 119 (the latter component was helpful for prototyping but may not be necessary in the future). The GPS/RTK Position sensor 23 assembly may be include a Leica SmartRover™ RTK Global Satellite Navigation System (GNSS) system, or a Trimble™ integrated 5800 GPS receiver as well as GPS/RTK rover receiver 116 and antenna 112, UHF radio 118, and power source in a single assembly (the GPS/RTK position sensor 23 components are detailed below in regard to FIG. 5).

Figure 4:
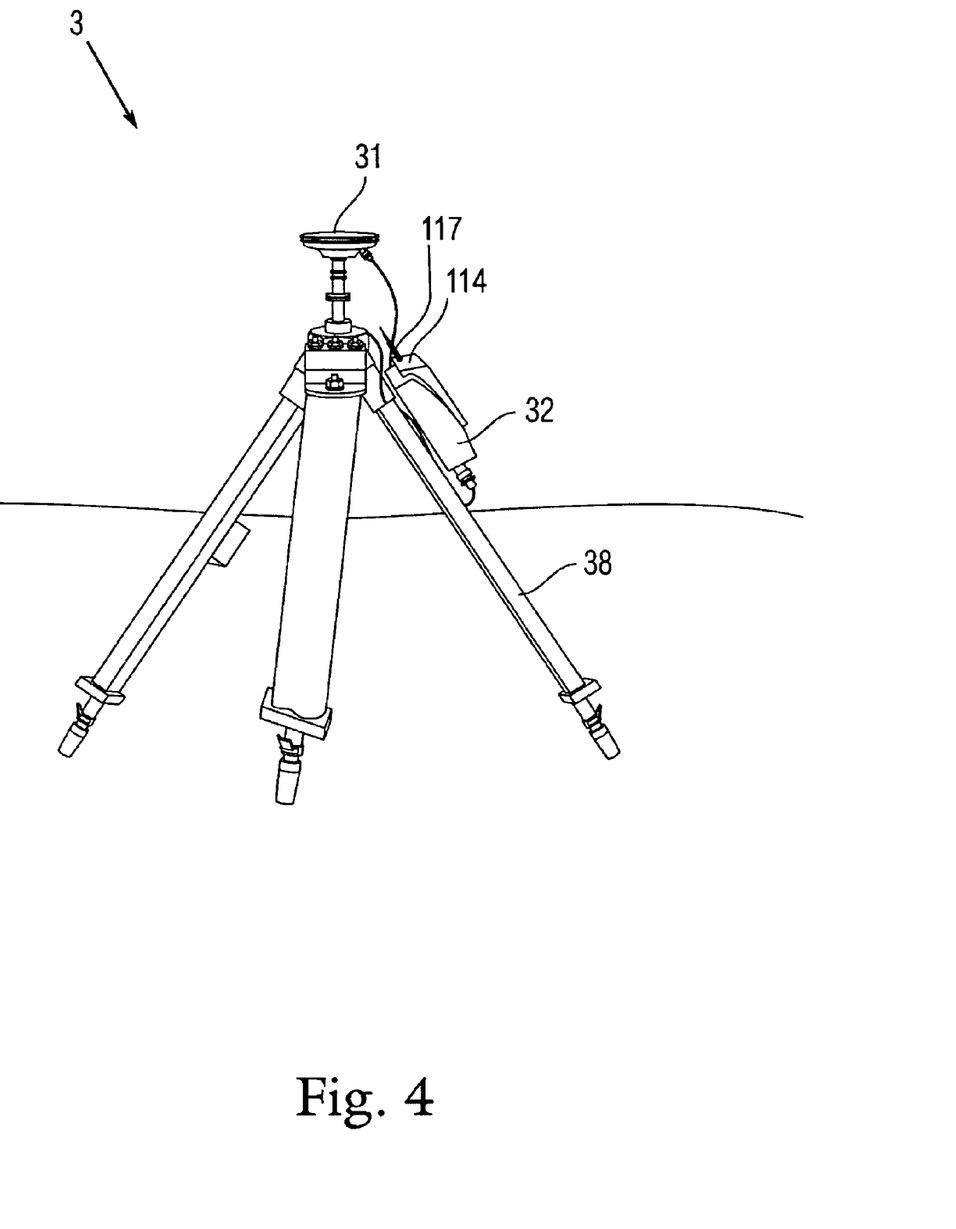
FIG. 4 is a perspective view of the GPS/RTK base station.

FIG. 4 is a perspective view of an exemplary RTK base station 3 for generating the RTK correction data. RTK base station 3 includes a GPS/RTK antenna 31, GPS/RTK receiver 32 with a UHF radio 117 (e.g., integrated GPS data link radio operating at 900 MHz), and RTK controller 114. The Leica SmartStation™ is a suitable integrated GNSS, or the Trimble™ AgGPS® RTK 900 and 450 Receiver combinations or other suitable RTK base stations will suffice for this purpose. The foregoing are mounted atop a commercial tripod 38 or other mounting platform.

Figure 5:
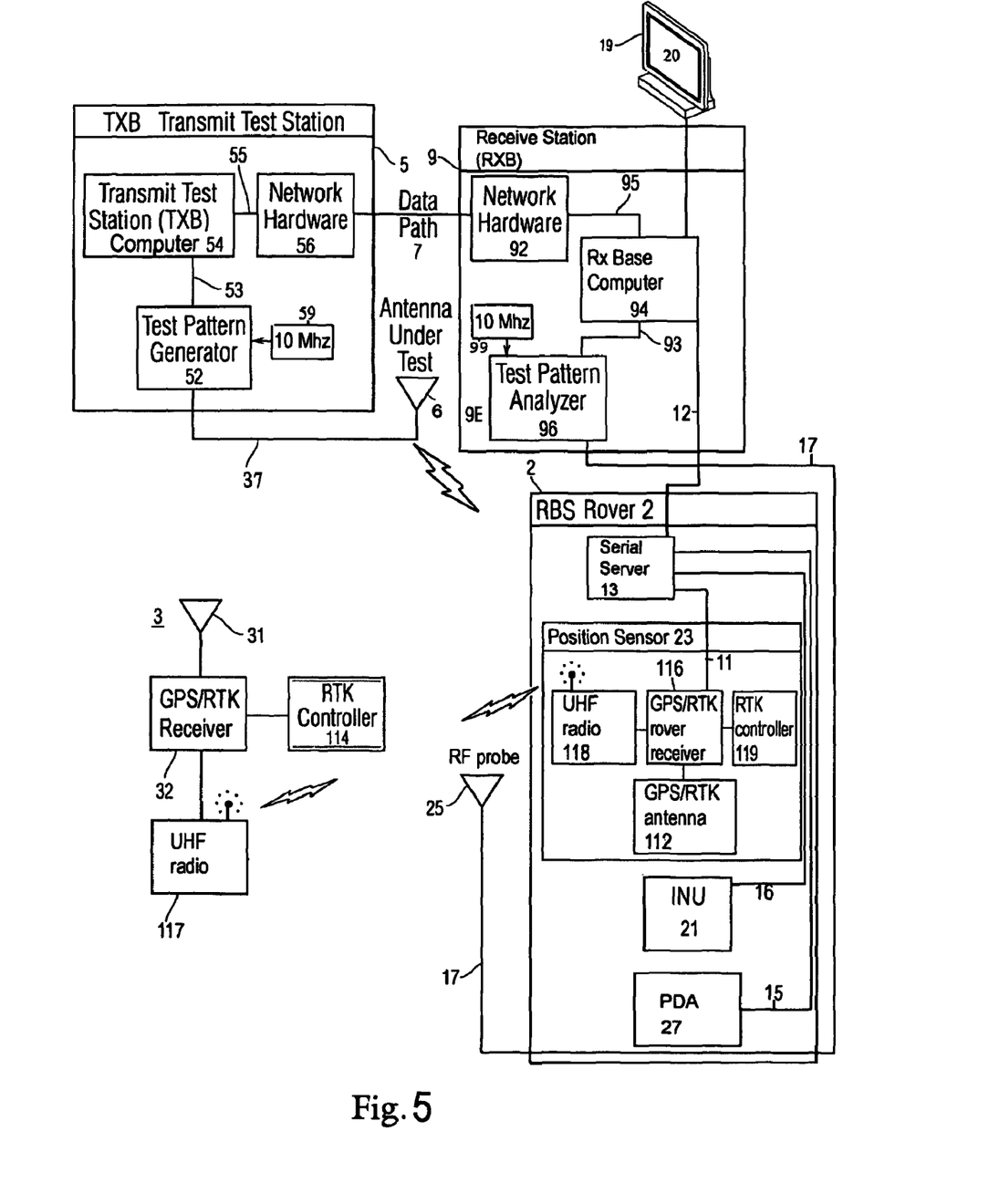
FIG. 5 is a component level diagram of an exemplary ATS such as in FIG. 1.

FIG. 5 shows an exemplary component level diagram of an ATS. TXB 5 is responsible for generation and control of test signals, and AUT 6 transmits the test signals generated by the TXB 5. The TXB 5 further comprises a TXB test pattern generator 52 connected by means of cable 37 to the AUT 6. TXB 5 also includes a TXB computer 54 for automatic control of the TXB test pattern generator 52, and TXB network hardware 56 for allowing the TXB computer 54 to communicate with a RXB 9. In this manner, an ATS software running in the RXB 9 can automatically control and implement all test frequency generation.

In this embodiment, test pattern generator 52 generates one or more test signals to be sent by AUT 6. The test pattern generator 52 may be any programmable RF test frequency generator capable of generating RF signals with a variety of parameters, such as an Agilent™ 81110A pulse/pattern generator or LabVIEW NI PXI-5671 generator.

A TXB computer 54 may be a conventional laptop computer or programmable controller running an ATS transmit software module. The ATS transmit software module of the TXB computer 54 handshakes with the main ATS software at RXB 9 for automated control of the TXB test equipment and situational awareness of one, more than one or all of the ATS components. A TXB computer 54 can be connected to a test pattern generator 52 by a data path 53 and to the TXB network hardware 56 by means of data path 55. TXB network hardware 56 provides connectivity between the TXB computer 54 and RX computer 94 in RXB 9 (to be described) by means of a data path 7. The TXB network hardware 56 may be, for example, a secure encrypted communications wireless Ethernet card at the laptop TXB computer 54, though one skilled in the art should understand that the network connectivity hardware may change due to range, signal level, or level of encryption needed.

The RXB 9 may comprise a conventional computer system or processor running the ATS software to be described, and including a conventional User Feedback Interface (display 19 and input devices such as keyboard, mouse, etc.). The RXB 9 is in network communication with the serial server 13 of the rover 2. Currently, the RXB 9 is physically connected to the serial server 13 of the rover 2 by an ethernet cable 12, and to an AUT 6 by an RF cable, the ethernet cable 12 from rover 2 and RF cable from an AUT 6 being wire-tied together. However, one skilled in the art should understand that these physical connections may be replaced by wireless. The RTK base station 3 can be replaced by an RTK reference station which provides fixed sites reference and which provides higher accuracy and longer range.

The exemplary RXB 9 captures and analyzes test signals. In this regard, the RXB 9 further comprises RXB network hardware 92 (a wireless Ethernet card, for example) in communication with TXB computer 54 for coordinating the software between RX base computer 94 and TXB computer 54. One end of RF cables 37 and 17 go to the TXB test pattern generator 52 and a test pattern analyzer 96, respectively. The other end of cables 37 and 17 go to AUT 6 and RF probe 25, respectively. In the example the 10 MHz reference devices are GPS reference receivers which receive a GPS signal and produce the 10 MHz reference signal based on a rising edge of a GPS signal. A common reference signal supplied to both the TXB test pattern generator 52 and test pattern analyzer 96 can provide more accurate frequency, amplitude and phase measurements, and for this purpose 10 MHz reference devices 59, 99 are connected to the test pattern generator 52 and test pattern analyzer 96, respectively. The network hardware (TXB network hardware 56 and RXB network hardware 92) can be used to connect and coordinate the software on the RX base computer 94 and TXB computer 54. A test pattern analyzer 96 captures the test signal from the RF probe 25. Meanwhile, the RXB network hardware 92 talks to the TXB network hardware 56 through data path 7 for synchronization between the RX base computer 94 and TXB computer 54. The RX Base computer 94 runs the main ATS receive software module for automated control of the RXB test equipment and situational awareness of all of the ATS transmit or receive components. The RX base computer 94 can be connected to the test pattern analyzer 96 by means of a data path 93, and to the RXB network hardware 92 by means of data path 95. The test pattern analyzer 96 may be, for example, an Agilent™ spectrum analyzer. The RX base computer 94 is also connected via the serial server 13 in rover 2 to its GPS/RTK position sensor 23, to the INU 21, PDA 27, by means of data paths 11, 16, 15, and 12, respectively. The RX base computer 94 is also connected to display 19 for creation of user feedback interface GUI 20. Currently, the outputs from GPS/RTK Position sensor 23, INU 21 and PDA 27 are RS232 or RS422 serial outputs that are routed into the serial server 13 via data paths 11, 16 and 15, respectively. Serial server 13 converts these serial inputs into a single Ethernet output over path 12, and hence to RX base computer 94. These serial data paths are currently serial cables but may optionally be wireless such as an UHF radio.

The exemplary RXB 9 inclusive of RX base computer 94 and display 19 are a conventional computer system running the ATS software. In practice, the rover 2 can be used to track various movements of ATS components which are moving during testing. Thus, given the illustrated configuration with a stationary antenna AUT 6 (and its support equipment), an AUT 6 position is collected at the beginning of the test for spatial representation throughout the test. In this configuration rover 2 can then track position and orientation of RF probe 25 and record data related to such tracking. Similarly, given a stationery RF probe 25 and moving AUT 6 configuration, then the rover 2 will track an AUT 6 position and orientation data. Again, the rover 2 can be used to track ATS components during a test. The ATS software time stamps all the information collected from the rover 2 including position sensor 23 and INU 21, and analyzes the time-stamped data from rover 2 to respectively calculate position and orientation of the AUT 6 relative to RF probe 25. Via the user feedback interface (display 19 and input devices), this embodiment of the ATS software provides test personnel a graphical situational awareness view of the test range, vehicles, testing points and all test equipment that makes up the present system. The ATS software also allows automated control of all test equipment with minimal user input, gathers all or selected pertinent test data and waveforms, and stores all relevant test information electronically for later examination and post processing by test personnel. Simulations of one or more AUTs in combination with various mounting structures such as vehicles can later be run based on stored data to eliminate a need to return to a test location as well. Specifically, an operator (or the ATS software automatically) moves an AUT 6, the RF probe 25, or both over a desired surface or test course. ATS software can pre-generate a test pattern including virtual test points and a variety of frequency plans. These virtual test points (and frequency plans) can then be taken to the testing range and implemented using a rover 2 to determine orientation and position of an AUT 6 for use in generating test data or representations. In one embodiment, given a pre-generated test pattern, as soon as a reference point (in this case for an AUT 6) is measured the ATS software running on a RXB base 9 computer 94 calculates real world positions of the virtual test points. RF probe 25 can then captures a RF test signal that an AUT 6 emits at one or more known real-world coordinates. Alternatively, reciprocal AUTs and an RF probe 25 can transmit and an AUT 6 thus receives one or more desired test signals. With RF probe 25 receiving, a RXB 9 can record amplitude (and optionally phase) of a RF signal received for a series of discrete data point across a virtual test field pattern of an AUT 6, and timestamp each data point. In addition, at each data point GPS/RTK position sensor 23 and INU 21 can provide position and orientation data, which is combined in a data set with time-stamped amplitude (and optional phase) data. Data points can be collected along a plane located one or more, e.g., two to five wavelengths, in front of an AUT 6, or along a surface of a cylinder or sphere that encloses an AUT 6 test area of interest to support/allow near field test pattern analysis.

The rover 2 uses a RF probe 25 to capture test signals, and INU 21 and GPS/RTK position sensor 23 are responsible for accurate position and orientation information for that section of the rover 2. Descriptions of exemplary embodiments of rover 2 sub-components are given below.

INU 21 comprises any suitable inertial navigation unit that provides highly accurate azimuth, pitch, and roll data for the orientation of rover 2, and which provides a high accurate north reference or direction reference. The INU could be replaced by other types of multi-axis orientation sensors capable of providing a direction reference and a change measurement between a reference angle (e.g., an angle based on a north measurement) and an orientation measurement. Celestial navigation systems could also be used with the INU system or to replace it. The INU 21 is in serial communication with the on-board serial server 13 (e.g., FIG. 3), which in turn establishes a cabled Ethernet data path 12 to the RXB 9.

GPS/RTK Position sensor 23 may comprise a GPS/RTK rover receiver 116, UHF radio 118, GPS/RTK antenna 112, and an RTK controller 119 (e.g., FIG. 3) identical to those used in the RTK base station 3 as described above. Indeed, the RTK controllers 114, 119 are redundant and just one such device may be used first on RTK base station 3 to activate it, and then moved to the rover 2 to bring that up and verify communications. Given confidence in the ATS software, an RTK controller 119 should not be necessary at all, and so an RTK controller 119 is optional in the rover 2. Also, an external data link radio (such as UHF radio in GPS/RTK receiver 32 to communicate the RTK correction signal between them, or Intuicom DL 1200) can be provided that plugs directly in the RTK rover receiver 116 (see FIG. 3) to provide a correction between the base and RTK rover receiver 116 and RTK base station 3 as well as a GPS/RTK receiver 32. This link is relativity transparent to the present system. The GPS components used in this embodiment of the rover 2 (including RTK rover receiver 116, RTK antenna 112, RTK controller 119, and UHF radio 118) are GX1230GG receivers, coupled to AX1202 antennas, RX1200 controllers, and the Intuicom DL1200 Data Link Radio, respectively.

In operation, a user will enter known (measured) offsets based on the GPS and RF probe 25 mounting (e.g., the physical configuration of hardware) during a test setup phase. The known (measured) offset data will be associated with at least one portion of the test system such as for example coordinates or distance from GPS antenna 112 to RF probe 25 or a test location characteristic, etc. As described below in regard to FIG. 9, this user defined offset data becomes the basis for determining by mathematical computations using a rotation matrix the coordinate locations of the test system and an RF probe 25. Then during actual testing, in the illustrated embodiment, the RTK/GPS rover receiver 116 determines position of the rover 2, and this information is passed to the RXB 9. The RTK base station 3 in this embodiment generates an RTK correction signal, and includes an RTK antenna 31, GPS/RTK receiver 32 with integrated UHF radio, and an RKT controller 114. RTK base station 3 provides the correction signal to the rover 2 for the purposes of providing more accurate position information. RTK base station 3 can include an RTK/GPS data link radio for sending position correction information. RKT controller 114 may be a commercial RTK GPS controller which in this embodiment comprises a Leica™ model specific to the receivers.

The corrected position information is processed by the rotational matrix so that measured orientation data, e.g., azimuth, pitch and roll, is modified in accordance with the known offsets to produce adjusted or compensated position data associated with the rover 2. Using this approach, GPS sensor data can be determined and applied to modified offsets to determine an antenna's actual position, azimuth, pitch and/or roll at a given point of time.

One skilled in the art should understand that the above-described configuration may be employed for different testing scenarios. For example, all of the AUT 6, TXB 5, RXB 9, and GPS/RTK base station 3 may remain stationery, while the rover 2 (with RF probe 25) moves relative to the rest of the components. Alternatively, the RF probe 25 may be held stationery as the AUT 6 moves. In this case, RF probe 25 is moved off the rover 2 and is held stationery as the rover 2 moves (with AUT 6) relative to the rest of the components. This allows the generation of the antenna patterns where there is only a limited area of interest to reflect such, for example, over a concrete road or a city street with adjacent buildings. This approach also provides a method to determine the effect of a concrete road or city street over all aspects of the vehicle. In sum, the components of the equipment tray 26 (inclusive of INU and position sensors 21, 23) can be attached to any moving test item (e.g., transmit or receive antenna), and provide coordinates and attitude for that testing.

An exemplary system may alternatively be operated in reverse with the RF probe 25 transmitting and AUT 6 receiving a series of RF signals. Embodiments of a RTK-based ATS can provide highly accurate positional information (1 cm horizontal and 2 cm vertical) for manipulation by ATS software. The INU can provide highly accurate orientation information (0.5 degrees or less) for manipulation by the ATS software as well. A user can select through the ATS software a reference point on an RF probe 25 connected to the equipment tray 26 and can change or preload different RF probes and their parameters through the ATS software.

As explained above in regard to FIG. 2, the PDA 27 is mounted on the mast 24 to provide navigation information to the user for moving the mast 24 (and hence the RF probe 25). Presently, the user manually pushes the mast 24, but the mast 24 could move robotically. Thus, one skilled in the art should understand that the software resident on the RX base computer 94 of the remote RXB 9 may automatically control the rover's GPS and robotically move the mast 24, in which case the PDA 27 is unnecessary. In the manual embodiment illustrated, the PDA 27 suffices to provide local user feedback and control at the portable rover 2 for moving the mast 24. In this embodiment, the PDA 27 has a graphical interface which provides directional instructions to a user for moving and positioning the mast 24 (RF probe 25) assembly to testing locations including predetermined test points (e.g., see FIG. 8). The PDA 27 GUI can display distance and vector information as well as elevation or other spatial references.

PDA 27 is likewise connected to the serial server 13 by RS232 or RS422 cable 15 and then on to the RXB 9 by Ethernet cable 12. The PDA 27 is currently provided on the rover 2 only as a matter of convenience for positional user-verification of what the ATS software is reading and, like the RTK controller 119, it is envisioned that when the ATS software has been fully verified the PDA 27 will be unnecessary on the rover 2. Only the RTK base station controller 114 will be necessary.

Figure 6:
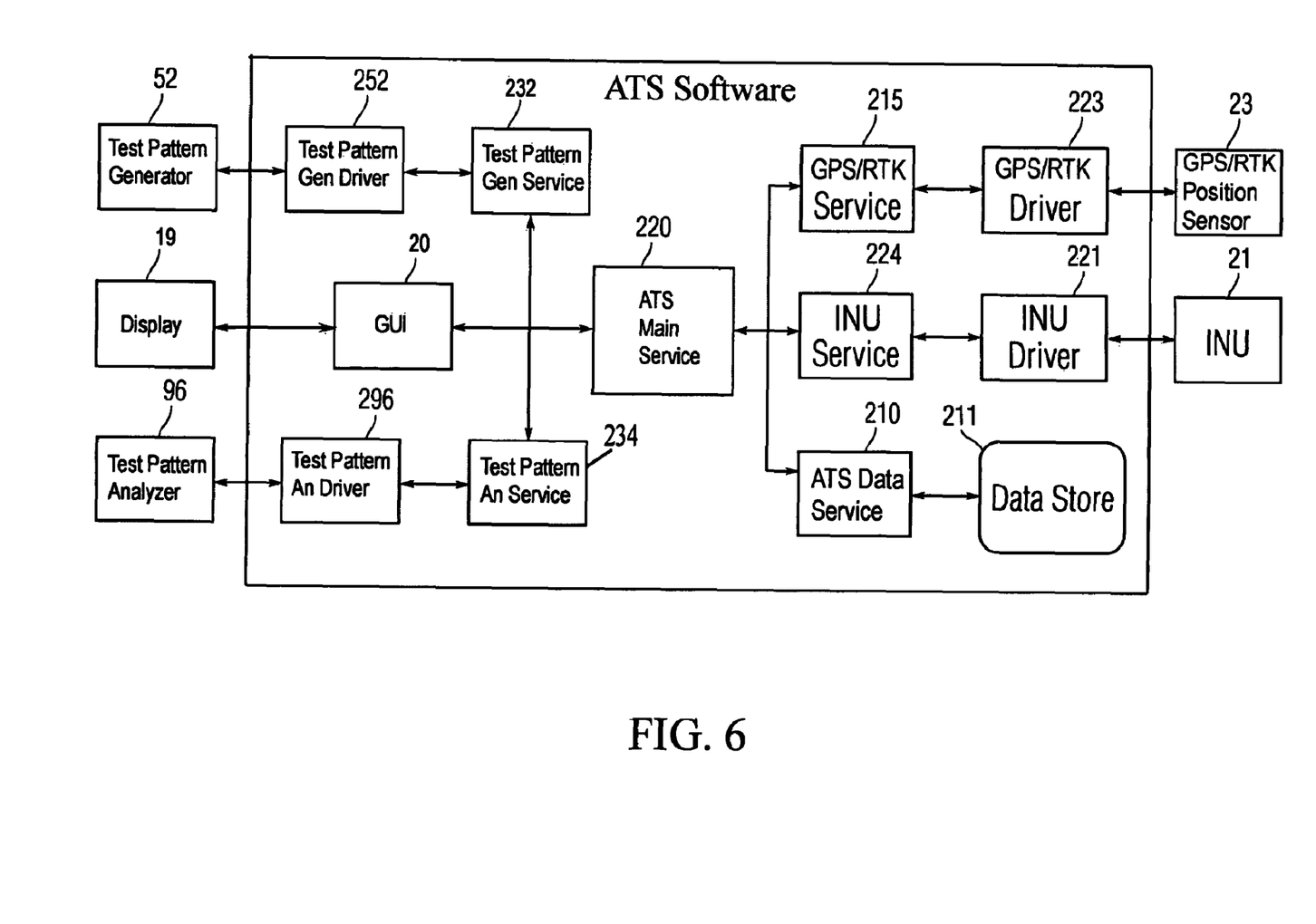
FIG. 6 is a flow chart illustrating an exemplary block diagram of the ATS software.

FIG. 6 shows an exemplary block diagram illustrating one basic layout of the ATS software main server package which runs on the RXB 9. This embodiment of the ATS software comprises the core ATS main service 220, and a plurality of service modules communicating with the ATS main service 220. In these embodiments, the term "server" can refer to a software implementation having various services or functions however other embodiments can employ a hardware server or a combination of hardware and software. Communication can be accomplished over an IP based network (wired or wireless) and data and command messages are passed across this network. The services then communicate with their respective drivers and sensor devices using device specific commands and data structures.

TXB test pattern generator 52 and test pattern analyzer 96 both can communicate through their respective drivers 252, 296 written to conform to the equipment manufacturer specifications and these drivers use device specific commands and data structures.

The same is true of the GPS/RTK position sensor 23 and INU 21 embodiments, which can communicate through their respective drivers 223, 221, and these drivers use device specific commands and data structures.

This embodiment of an ATS main service 220 communicates with Test Pattern Gen driver 252, Test Pattern An driver 296, GPS/RTK Driver 223, and INU driver 221 through five (5) service modules, including a ATS data service 210, GPS/RTK service 215, INU service 224, Test Pattern Gen(erator) service 232, and Test Pattern An(alyzer) service 234.

In this embodiment, the ATS main service 220 is the main hub for all of these other services and for the ATS display 19 and GUI 20.

This exemplary ATS data service 210 manages the storage and retrieval of all system data, test data, and configuration information in a data store 211 which comprises a collection of databases, for example Microsoft Access™ databases. In addition, Microsoft Excel™ may be used to apply post-processing steps and to pull test data results from the ATS databases.

The exemplary INU service 224 interacts between the INU driver 221 and the ATS main service 220. It is possible to have multiple INU services 224 running to accommodate multiple INUs 21. Each INU service 224 has an instance number assigned to it, and those instances are attached to the INUs 21.

Similarly, this example of an ATS GPS/RTK service 215 interacts between the GPS driver 223 and the ATS main service 220. It is possible to have multiple GPS/RTK services 215 if there are multiple GPS devices 23. Each service has an instance number assigned to it, and those instances are attached to the various GPS/RTK sensors 23.

The exemplary test pattern generator service 232 interacts between the test pattern generator driver 252 and the ATS main service 220. Currently, it is possible to have only one test pattern generator service 232 running.

In this embodiment, a test pattern analyzer service 234 interacts between the test pattern analyzer driver 296 and the ATS main service 220. Similarly, it is currently possible to have only one test pattern analyzer service 234 running.

A configuration program is used to configure the above-described service modules via the ATS GUI 20.

Figure 7:
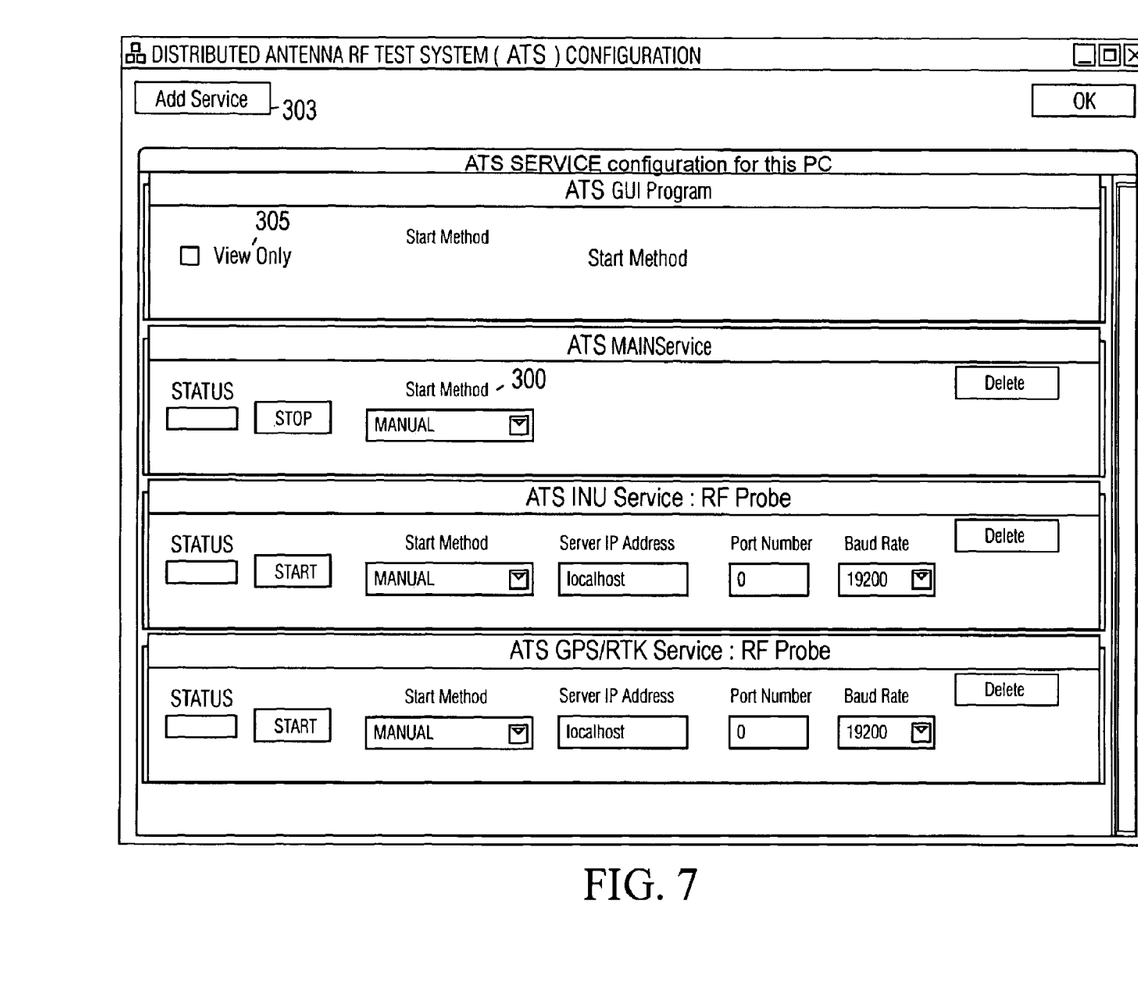
FIG. 7 is an exemplary view of an ATS software configuration screen.

FIG. 7 is a screen print of an exemplary embodiment of an ATS configuration screen. Each of the above described services must be initiated by adding it to the configuration, and to add any service into the system a user clicks the Add Service button (top left), which initiates an Add Process Dialog that allows the user to select a service from a list. After a service has been selected from the list and an instance number has been assigned, the service appears on this screen. ATS INU Service (e.g., INU Service 224 in FIG. 6)

FIG. 7 shows an exemplary configuration program with the ATS main service 220, GPS/RTK service 215, and INU service 224 (of FIG. 6) all added after clicking the "Add Service" button 303 three times. More services can be added by this process. The "View Only" checkbox 305 allows a PC to connect to the main service 220 to read/access a test in progress for a test being controlled by another RXB 9. The list items for each added service can have the following parameters included:

Status Indicator—Green if running, else red.
START/STOP button.
Start Method list—If a Service's Start Method is set to Manual, the service must be started and stopped by the user. If it is set to Automatic, the Service will be started when the computer is turned on.
Server IP Address edit.
Port Number edit.
Baud Rate list—This list is insensitive because the values are preset.

In this embodiment, each service can be started and stopped at any time if there is a need to do so. When started, each service automatically connects to the ATS main service 220. If the ATS main service 220 is stopped, the other services' connection status indicators turn red. When the ATS main service 220 is restarted, the other services will reconnect automatically.

The exemplary ATS GUI 20 interacts with the ATS main service 220. No processing can occur if the ATS display 19 is not connected with the ATS main service 220 in this embodiment.

Figure 8:
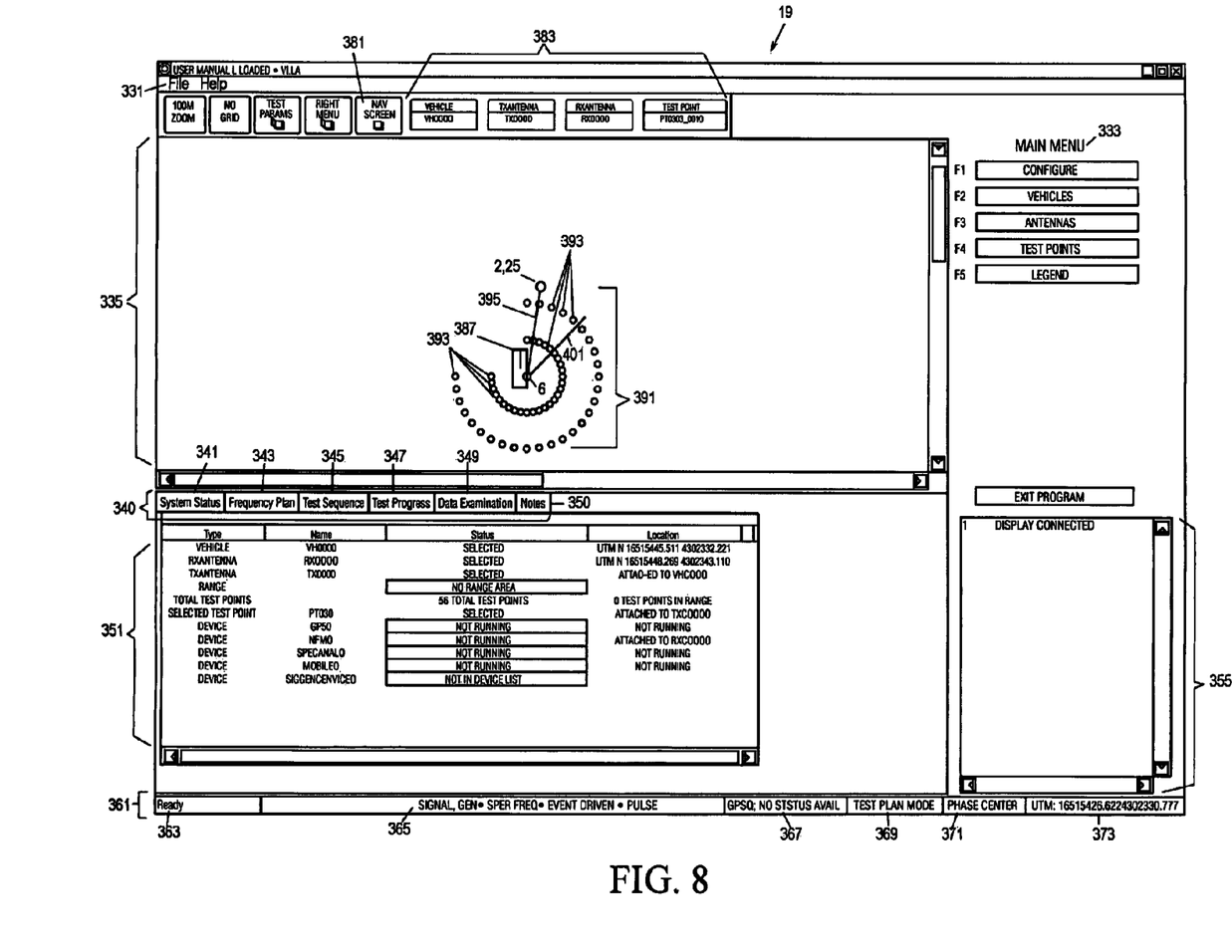
FIG. 8 is an exemplary view of an ATS software graphical user interface (GUI)

FIG. 8 is a screen print of an exemplary ATS GUI 20 screen, which allows the user to do at least the following processing:

Create/load Test Plans using the File Menu 331.
Create Test Plan Templates using File Menu 331.
Add, edit, and select the following objects of a Test Plan: Vehicles transmit antenna, e.g., AUT 6, receive antenna, e.g., RF probe 25, TX and RX Antennas; Test Points; etc.
View a Graphical Representation of the Test Plan (e.g., as illustrated) in test pattern display area 335.

The Test Parameters Area 340 includes a plurality of tabs that allow user-selection of information about the status and progress of the current test. The Test Parameters Area 340 includes the following tabs:

System Status 341.
Frequency Plan 343.
Test Sequence 345.
Test Progress 347.
Data Examination 349.
Notes 350.

More specifically, using the Test Parameters Area 340 tabs, a user can accomplish the foregoing:

View a System Status list that gives information about the current configuration using System Status tab 341, including information about the foregoing objects inclusive of Type (what the items of the test are), Name (the name chosen for the item), Status (the current status of the item), Location (the coordinates of the item or what it is attached to);
Create Frequency Plans for Testing using Frequency Plan tabs 343
Create Test Sequences for Testing using Test Sequence tab 345.
Perform Testing to collect data using test Progress tab 347.
Examine the collected data using Data Examination tab 349.
Enter any notes at any time in order to aid in the analyzing process using Notes tab 350.

In order to use the test equipment in this particular embodiment (e.g., FIG. 5), hardware must be set up and running, the ATS main service 220, GPS/RTK service 215, and INU service 224 must be running, an RX antenna object must be defined, attached to the GPS/RTK service and INU service, transmit antenna (e.g., AUT 6), and be the selected RX antenna (e.g., RF probe 25).

FIG. 8 shows two sets of test points 393 corresponding to an AUT 6, one closer to the center than the other. Each circle of test points in this example are set via test point selection from main menu 333 with parameters to include radius/angle between test points, distance from AUT 6 center, etc. Software action log 355 logs/shows all software actions processed by ATS main service 220.

Note that FIG. 8 shows an exemplary test with a stationary AUT 6. Other test pattern displays will be shown with other variations in the ATS. Status bar 361 on the lower part of this interface screen displays current information/status on ATS 363, test pattern generator 52 configuration 365, GPS/RTK signal quality 367, current mode of software 369 (e.g. test plan mode, test run mode, data collection mode), current rotation matrix setting 371 (e.g., RF probe 25, phase center, RF probe 25 tip or GPS head 112), and current position of rover 2 373 (e.g., Universal Transverse Mercator (UTM) coordinates. Test Pattern Display area 335 displays an AUT 6 and/or another structure the AUT is coupled to, e.g., a vehicle 387, RF probe 25, rover 2, test points 393, azimuth line of RF probe 25 395 (INU 21 determines azimuth of RF probe 25), azimuth line of AUT 6 401 if AUT 6 is a directional antenna.

Figure 9:
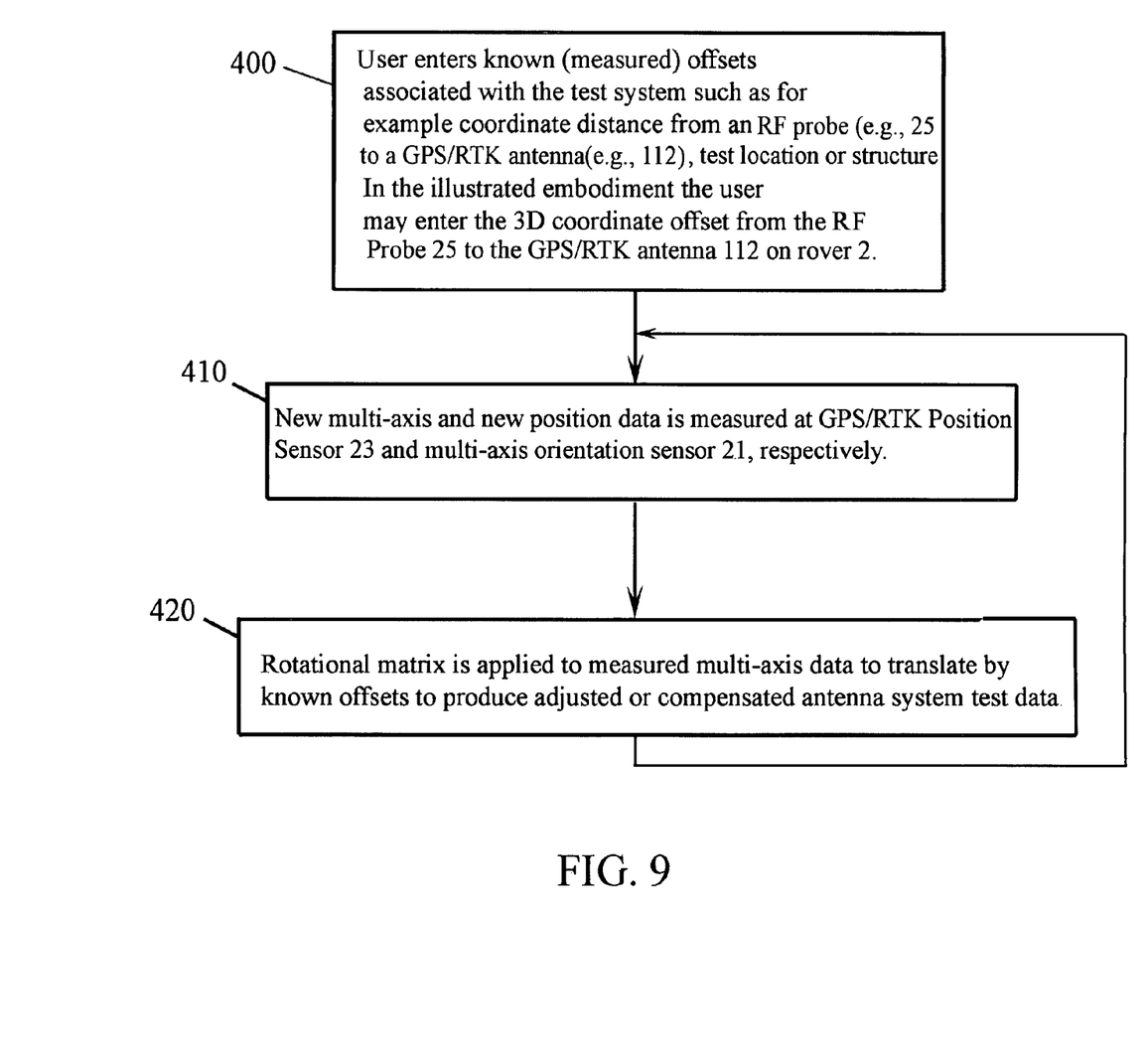
FIG. 9 is a flowchart illustrating an exemplary measurement sequence.

FIG. 9 is a flowchart illustrating an exemplary basic measurement sequence.

Manipulation of test data in one exemplary embodiment includes use of a "rotational matrix" and user input offset data. A rotational matrix is a known construct that uses an n×n matrix to effect a geometric rotation about a fixed origin in Euclidean space. In the present context, the basic steps for applying a rotational matrix as shown in FIG. 9 include at step 400, a user enters known (measured) offsets based on the GPS/RTK antenna 112 and RF probe 25 mounting (e.g., the physical configuration of hardware) during a test setup phase. The known (measured) offset data will be associated with at least one portion of the test system such as for example coordinates or distance from an antenna under test AUT 6 to a GPS sensor, a test location characteristic or a structure which a transmitter or receiver antenna (e.g., RF probe 25 or AUT 6) is mounted thereon. The known offset data is captured and stored in a data structure. This user defined offset data becomes the basis for determining by mathematical computations using a rotation matrix the coordinate locations of a second section of the test system and the antenna(s) under test.

Next, at step 410 (during run mode), new multi-axis and new position data is measured. The three dimensional GPS or location data is captured and stored in a data structure.

Next, at step 420, the measured multi-axis data and known offsets are data is translated into a rotational matrix where the measured orientation data, e.g., azimuth, pitch and roll, is modified in accordance with the known offsets to produce adjusted or compensated position data associated with a selected point, e.g., on the rover 2.

The measurement process may continue in run mode repeating steps 410-420 using the offset data from step 400 as desired.

Using this approach, GPS/RTK sensor data can be determined and applied to modified offsets to determine an antenna's actual position based on an INU's azimuth, pitch and roll at a given point of time. For example, a rotational matrix has been successfully employed to produce correct RF probe 25 positions by having software calculate the RF probe 25 positions using GPS/RTK antenna 112 positions and INU 21 data. This exemplary system was validated by removing the GPS/RTK sensor head from the tray and placing it on an antenna under test at a selected location such that the GPS/RTK was physically rotated in real time to show actual GPS/RTK position on the antenna under test in various test locations which correlated to the actual antenna under test in previous locations where test data was collected and stored by an embodiment of this invention. Test system sensor measurement data can be modified to produce compensated data using offsets associated with at least one portion (any portion) of the test system, or any piece of equipment that the test system is mounted upon. The offset data can include item identifier data, reference points, dimension data associated with two or more components in a test system, height data, signal refraction data, signal reflection data or component characteristic data It should now be apparent that the foregoing description provides a portable test-anywhere RF antenna test station complete with on-board software to record amplitude (and optionally phase) with coordinate and orientation (e.g., pitch, roll, yaw) data at discrete data points, and processes the data to render a far-field pattern representing an antenna under test AUT or antenna field, allowing for greatly decreased time and labor in testing.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. An antenna test system, comprising:
a first section adapted to determine and output coordinate location data for at least a first portion of said antenna test system;
a second section adapted to determine and output orientation data for at least a second portion of said antenna test system, said orientation data comprising multi-axis orientation data;
a third section adapted for determining and storing a plurality of signal measurement data comprising amplitude data associated with an electromagnetic field produced by at least one antenna under test at a plurality of respective test control points;
a fourth section adapted to receive said coordinate location data for said first portion, said orientation data for said second portion, said plurality of signal measurement data and producing a plurality of output data comprising compensated position data associated with at least one portion of said antenna test system comprising said third section, test location data comprising said coordinate location data, said signal measurement data and said multi-axis orientation data, wherein said compensated position data is determined using at least one said multi-axis orientation data and at least one offset data comprising relationship data associated with at least two portions of said antenna test system comprising said first and second portions of said antenna test unit;
a fifth section adapted to output at least one spatial representation related to said at least one antenna under test based on said output data, wherein said spatial representation comprises said amplitude data of an electromagnetic field emitted by or received by said at least one antenna under test at one or more measurement locations comprising each said compensated position data point.

2. The antenna test system according to claim 1, wherein said first section further comprises a position sensor adapted to determine and output the coordinate location data for said at least one antenna under test.

3. The antenna test system according to claim 2, wherein said position sensor comprises a GPS position sensor.

4. The antenna test system as in claim 3, wherein said GPS position sensor further comprises an RTK position sensor.

5. The antenna test system as in claim 4, further comprising an RTK base station for generating an RTK correction signal.

6. The antenna test system as in claim 3, wherein said GPS position sensor further comprises an RTK position sensor, said antenna test system further comprises a sixth section adapted to determine and output coordinate location data for location separate from said first portion of said antenna test system, wherein said first section and sixth section cooperate to generate a correction signal for increasing accuracy of said first section's coordinate location data for at least a first portion of said antenna test system.

7. The antenna test system as in claim 6, further comprising an RTK base station for generating an RTK correction signal.

8. The antenna test system according to claim 1, wherein said second section second sensor comprises an orientation sensor adapted to determine and output multi-axis orientation data for said at least one antenna under test.

9. The antenna test system according to claim 8, wherein said orientation sensor further comprises an inertial navigation unit.

10. The antenna test system according to claim 1, wherein said third section comprises a test pattern analyzer.

11. The antenna test system according to claim 10, wherein said computer runs antenna test software that compensates the coordinate location data based on the multi-axis orientation data.

12. The antenna test system according to claim 11, wherein said computer presents a graphical user interface that displays an emission pattern for said antenna under test.

13. The antenna test system according to claim 12, wherein said graphical user interface provides a representation of said antenna under test and is adapted for multi-axis manipulation and simulation of said antenna under test in said graphical user interface.

14. A system as in claim 11, wherein said compensated position data is further determined using a user defined offset determined by using a plurality of coordinate data and at least one measurement of the difference between at least one coordinate locations of said second section and said at least one antenna under test.

15. A system as in claim 14 wherein said user defined offset is determined in part by mathematical computations using a rotation matrix comprising coordinate locations of said second section and said at least one antenna under test.

16. The antenna test system according to claim 1, wherein said fourth section comprises a computer adapted for determining and storing a plurality of datasets.

17. The antenna test system according to claim 16, wherein each of said datasets includes amplitude of a test signal to/from said at least one antenna under test, coordinate location of the antenna under test, and multi-axis orientation data for the antenna under test and a time stamp.

18. The antenna test system according to claim 17, further comprising a test pattern generator coupled to a probe mounted on a rover, for generating said test signal to the at least one antenna under test.

19. The antenna test system according to claim 17, further comprising a test pattern generator coupled to said at least one antenna under test and mounted on a rover, and a stationery probe for receiving said test signal from the at least one antenna under test.

20. The antenna test system according to claim 17, further comprising a moving probe for generating said test signal to a stationery said antenna under test.

21. The antenna test system as in claim 1, further comprising a transmit test station connected to an antenna under test for generating test signals and transmitting said test signals over the antenna under test.

22. The antenna test system as in claim 1, wherein said orientation data comprises yaw, pitch and roll data.

23. The antenna test system as in claim 1, further comprising at least one gyro for generating at least one said orientation data.

24. The antenna test system as in claim 1, further comprising at least one accelerometer for generating at least one said orientation data.

25. The antenna test system as in claim 24, wherein said accelerometer is adapted to function substantially within six degrees of freedom: +/−x, y or z axis.

26. The antenna test system as in claim 1, further comprising a graphical user interface for inputting and storing test location related data, number of samples, at least one user input offset data associated with test location data, measurement flag data comprising GPS flag data, test frequency range data, signal generator data, transmitter movement data, receiver movement data, mobile test station in use flag data, action list data, object parameter data comprising data related to a structure said antenna under test is mounted to, antenna under test data comprising transmitter related data and receiver related data.

27. The antenna test system as in claim 1, further comprising a handheld computing device comprising a transmitter/receiver and a graphical user interface for controlling at least one portion of said antenna test system.

28. The antenna test system as in claim 1, further comprising a sixth portion adapted to transmit encrypted signals between at least one portion of said antenna system and another portion of said antenna system.

29. The antenna test system as in claim 1, wherein said offset data comprises at least one of the following group: equipment identifier data, reference point data, dimension data associated with two or more components in said antenna test system, height data, signal refraction data, signal reflection data or component characteristic data.

30. The antenna test system as in claim 1, further comprising a graphical user interface adapted to permit a user to input configuration data and execute stored processing sequences for producing said output data, wherein said configuration data comprises offset data comprising relationships between at least two portions of said antenna test system.

31. The antenna test system as in claim 1, further comprising a mobile mounting structure adapted to mount at least said first through fourth sections and to permit said mobile mounting structure to be selectively positioned through a predetermined intended path or control points in order to measure an electromagnetic spectrum emitted by said antenna under test.

32. An antenna test system comprising:
a transmit test station comprising a transmit test station computer, a test pattern generator, a signal generator coupled to said test pattern generator, network hardware for communicating with external systems, and an antenna under test which is coupled to said test pattern generator;
a fixed site global positioning indicator (GPS) and real time kinetic (RTK) base station comprising a first GPS and RTK system and antenna that is adapted to produce a first coordinate location data, and a first communication device;
a mobile platform comprising a position sensor, an inertial navigation unit, an electromagnetic spectrum probe, a computer and display unit, and network hardware for communicating with external systems, wherein said position sensor comprises a second GPS and RTK system and antenna adapted to produce a second coordinate location data based in part on said first coordinate location data, and a second communication device for communicating with said first communication device in said fixed site global positioning indicator (GPS) and real time kinetic (RTK) base station, and an inertial navigation unit adapted to produce multi-axis orientation data, wherein said first and second GPS and RTK systems cooperate to provide real-time corrections to said second coordinate data produced by said second GPS and RTK system; and
a receive station comprising:
a receive base station computer;
a test pattern analyzer coupled to said receive base station computer, a signal generator, and said electromagnetic spectrum probe and adapted to measure a plurality of signal measurement data taken at test control points as designated by a user input associated with an electromagnetic field produced by said antenna under test comprising amplitude data;
a network hardware coupled to said receive base station computer for communicating with external systems; and
a plurality of processing sequences stored in a data storage media in said receive base station computer;
wherein said plurality of processing sequences are adapted to receive said second coordinate location data from said first GPS and RTK system and said plurality of signal measurement data taken at test control points as designated by a user input and producing a plurality of output data comprising compensated position data associated with a location of said electromagnetic spectrum probe at said test control points, test location data comprising said second coordinate location data, said signal measurement data, and said multi-axis orientation data, wherein said compensated position data is determined using at least one said multi-axis orientation data and at least one offset data comprising relative position relationship data associated with at least two portions of said antenna test system comprising said second GPS and RTK system and said electromagnetic probe location;
wherein said plurality of processing sequences further comprise processing sequences adapted to output at least one spatial representation related to at least said electromagnetic field produced by said antenna under test measured by at least one said electromagnetic spectrum probe stored within said output data, wherein said spatial representation comprises said amplitude data of at least said electromagnetic field produced by said antenna under test at one or more measurement locations comprising each said compensated position data point;
wherein said network hardware components are adapted to communicate with at least one of the other network hardware components.

33. An antenna test system as in claim 32, wherein said at least one spatial representation related to at least said electromagnetic field is displayed or output on an output device.

* * * * *